(12) United States Patent
Hishiki et al.

(10) Patent No.: US 10,727,171 B2
(45) Date of Patent: Jul. 28, 2020

(54) LEAD FRAME

(71) Applicant: OHKUCHI MATERIALS CO., LTD., Kagoshima (JP)

(72) Inventors: Kaoru Hishiki, Kagoshima (JP); Ryouichi Yoshimoto, Kagoshima (JP); Ichinori Iidani, Kagoshima (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 15/823,760

(22) Filed: Nov. 28, 2017

(65) Prior Publication Data
US 2018/0158760 A1 Jun. 7, 2018

(30) Foreign Application Priority Data
Dec. 5, 2015 (JP) .................................. 2016-236122

(51) Int. Cl.
*H01L 23/495* (2006.01)
*H01L 21/48* (2006.01)
*H01L 23/498* (2006.01)

(52) U.S. Cl.
CPC .... *H01L 23/49548* (2013.01); *H01L 21/4825* (2013.01); *H01L 21/4828* (2013.01); *H01L 21/4832* (2013.01); *H01L 23/49517* (2013.01); *H01L 23/49534* (2013.01); *H01L 23/49579* (2013.01); *H01L 23/49861* (2013.01); *H01L 23/49582* (2013.01); *H01L 2224/16245* (2013.01)

(58) Field of Classification Search
CPC ...................... H01L 21/4828; H01L 23/49558
See application file for complete search history.

(56) References Cited

U.S. PATENT DOCUMENTS

| | | | |
|---|---|---|---|
| 7,232,755 B1* | 6/2007 | McLellan | H01L 21/4821 438/674 |
| 9,331,003 B1* | 5/2016 | Camacho | H01L 23/49541 |
| 2009/0068799 A1* | 3/2009 | Shen | H01L 21/4828 438/127 |
| 2009/0189296 A1* | 7/2009 | Wu | H01L 23/3114 257/778 |
| 2012/0074547 A1* | 3/2012 | Do | H01L 21/4832 257/676 |
| 2012/0146199 A1* | 6/2012 | Mcmillan | H01L 21/4828 257/666 |
| 2014/0167236 A1* | 6/2014 | Do | H01L 21/56 257/676 |

* cited by examiner

*Primary Examiner* — Benjamin P Sandvik
(74) *Attorney, Agent, or Firm* — Wenderoth, Lind & Ponack, L.L.P.

(57) ABSTRACT

A lead frame includes a plurality of leads formed from a metal plate having a front side and a back side, a first resin member, and a second resin member. The leads have side faces thereof fixed with the first resin member. Faces serving as internal connectors of the leads are uncovered on the side of the front-side surface of the first resin member, and faces serving as external connectors of the leads are uncovered on the side of the back-side surface of the first resin member. The second resin member is formed on the front-side surface of the first resin member to be at a level higher than the faces serving as the internal connectors, and has openings for leaving the faces serving as the internal connectors uncovered.

8 Claims, 4 Drawing Sheets

LEAD FRAME

CROSS-REFERENCE TO RELATED PATENT APPLICATIONS

This application claims the benefit of Japanese Patent Application No. 2016-236122 filed in Japan on Dec. 5, 2016, the contents of which are incorporated herein by reference.

BACKGROUND OF THE INVENTION

1) Field of the Invention

The present invention relates to a lead frame, specifically to a lead frame for flip-chip connection of a semiconductor element in manufacturing a QFN package (Quad Flat Non-leaded Package).

2) Description of Related Art

In recent years, in place of a semiconductor device in which a semiconductor element and substrate terminals are interconnected by wire bonding, there has come to be popular a semiconductor device in which flip-chip connection is established with favorable electric characteristics because of a short wiring resulting from a reduced mounting area.

As a flip-chip connection method, there is, for example, as described in Japanese Patent Application Laid-Open (KOKAI) No. 2013-138261, a method in which a semiconductor element is mounted on substrate terminals in manufacturing of a QFN package via a solder and in which the solder is melted by reflow to thereby establish connection between the semiconductor element and the substrate terminals.

The flip-chip connection method is a mount technique suitable for next-generation semiconductor devices that are becoming smaller, thinner, higher in frequency and higher in speed.

SUMMARY OF THE INVENTION

A lead frame according to some embodiments of the present invention includes a plurality of leads formed from a metal plate having a front side and a back side, a first resin member, and a second resin member, wherein the plurality of leads have side faces thereof fixed with the first resin member, faces that are to serve as internal connecting portions of the plurality of leads are configured to be uncovered on a side of a front-side surface of the first resin member, and the second resin member is formed on the front-side surface of the first resin member to be at a level higher than the faces that are to serve as the internal connecting portions and has openings that leave the faces that are to serve as the internal connecting portions uncovered.

Also, a lead frame according to some embodiments of the present invention includes a metal plate partitioned into a plurality of lead portions by a concavity formed on a front-side surface thereof, a first resin member, and a second resin member, wherein the plurality of lead portions have side faces thereof fixed with the first resin member, faces that are to serve as internal connecting portions of the plurality of lead portions are configured to be uncovered on a side of a front-side surface of the first resin member, and the second resin member is formed on the front-side surface of the first resin member to be at a level higher than the faces that are to serve as the internal connecting portions and has openings for leaving the faces that are to serve as the internal connecting portions uncovered.

These and other features of the present invention will become apparent from the following detailed description of the preferred embodiments when taken in conjunction with the accompanying drawings.

BRIEF DESCRIPTION OF THE DRAWINGS

FIG. 1A is a plan view of a multi-row lead frame, FIG. 1B is a plan view from a front side of an individual lead frame arranged in the multi-row lead frame of FIG. 1A, FIG. 1C is a cross-sectional view taken along A-A in FIG. 1B, FIG. 1D is a cross-sectional view taken along B-B in FIG. 1B, and FIG. 1E is an enlarged partial view of FIG. 1C.

DETAILED DESCRIPTION OF THE PREFERRED EMBODIMENTS

Figure 1A:
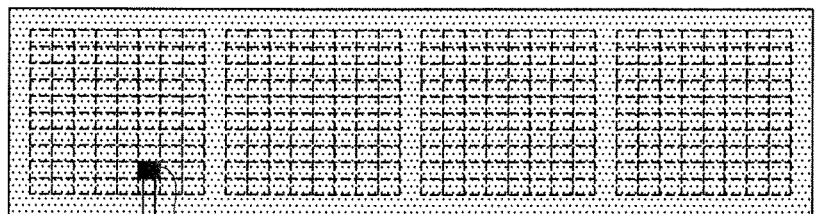
FIGS. 1A-1E show a configuration of a lead frame according to a first embodiment of the present invention, where

Preceding the explanation of embodiments, function and effect of the present invention will be explained.

A lead frame according to some embodiments of the present invention includes a plurality of leads formed from a metal plate having a front side and a back side, a first resin member, and a second resin member, wherein the plurality of leads have side faces thereof fixed with the first resin member, faces that are to serve as internal connecting portions of the plurality of leads are configured to be uncovered on a side of a front-side surface of the first resin member, and the second resin member is formed on the front-side surface of the first resin member to be at a level higher than the faces that are to serve as the internal connecting portions and has openings that leave the faces that are to serve as the internal connecting portions uncovered.

Also, a lead frame according to some embodiments of the present invention includes a metal plate partitioned into a plurality of lead portions by a concavity formed on a front-side surface thereof, a first resin member, and a second resin member, wherein the plurality of lead portions have side faces thereof fixed with the first resin member, faces that are to serve as internal connecting portions of the plurality of lead portions are configured to be uncovered on a side of a front-side surface of the first resin member, and the second resin member is formed on the front-side surface of the first resin member to be at a level higher than the faces that are to serve as the internal connecting portions and has openings for leaving the faces that are to serve as the internal connecting portions uncovered.

In the configuration where the second resin member is formed to be at a level higher than the faces that are to serve as internal connecting portions as in some embodiments, a side face of each opening and an uncovered part of each face to serve as an internal connecting portion form a concavity.

Here, in flip-chip mounting of a semiconductor element via connecting solder, the face to serve as an internal connecting portion of a lead, which constitutes the bottom surface of the concavity, is a surface to be connected with the connecting solder, and is surrounded by the side face of the concavity, or the side face of the opening. Therefore, when the connecting solder gets melted, the molten solder is prevented from flowing in the horizontal direction by the side face of the concavity. Also, the capacity of the concavity prevents overflow of the molten solder.

Therefore, according to some embodiments, since control of molten solder comes to be easier, it is possible to prevent solder bleeding and to prevent short circuit of the wiring caused by contact of bleeding solder with adjacent terminals.

In some embodiments, each of the openings in the second resin member is formed to have such a size as to leave the entirety or a part of each of the faces that are to serve as internal connecting portions uncovered.

Forming each of the openings in the second resin member to have such a size as to leave a part of each of the faces that are to serve as internal connecting portions uncovered can sufficiently secure an area necessary for flip-chip connection of a semiconductor element via solder. It is noted that each of the openings in the second resin member may be formed to have such a size as to leave the entirety of each of the faces that are to serve as the internal connecting portions uncovered.

In some embodiments, the front-side face of each lead is larger than the back-side face thereof.

In the configuration where its front-side face is larger than the back-side face, the lead substantially has a L-shape or T-shape as viewed from the lateral side, and thus adhesion to the first resin member is improved, to prevent the lead from coming off the first resin member.

In some embodiments, in each lead, at least either of the face that is to serve as the internal connecting portion and a face that is to serve as an external connecting portion is provided with a plating layer.

The lead frame of some embodiments as described above can be manufactured, for example, through: a step of forming, on the front side of a metal plate, a first resist mask having openings that are to be used for forming a first plating layer serving as internal connecting portions, as well as forming, on the back side of the metal plate, a first resist mask having openings that are to be used for forming a second plating layer serving as external connecting portions; a step of forming, in the openings of the first resist mask on the front side of the metal plate, the first plating layer serving as the internal connecting portions, as well as forming, in the openings of the first resist mask on the back side of the metal plate, the second plating layer serving as the external connecting portions; a step of removing the first resist masks from both of the front side and the back side of the metal plate; a step of forming, on the front side of the metal plate, a second resist mask that covers the first plating layer but has openings for leaving the remaining portions of the front side uncovered, as well as forming, on the back side of the metal plate, a second resist mask that covers the entirety of the back side; a step of performing half-etching down to a predetermined depth from the front side of the metal plate upon use of the second resist masks on both of the front side and the back side as etching masks, to form a first concavity; a step of forming fixing resin in the first concavity; a step of removing the second resist masks respectively from both of the front side and the back side; a step of performing etching from the back side, where the second plating layer is formed, upon use of the second plating layer as an etching mask, for unearthing the fixing resin, to form a second concavity with a bottom surface thereof being made of the fixing resin; a step of forming reinforcing resin in the second concavity to be integrally connected with the fixing resin, to thereby complete a first resin member; and a step of forming, on a front-side surface of the first resin member, a second resin member having openings that leave the faces serving as the internal connecting portions uncovered.

Also, the lead frame of some embodiments as described above can be manufactured, for example, through: a step of forming, on the front side of a metal plate, a first resist mask having openings that are to be used for forming a first plating layer serving as internal connecting portions, as well as forming, on the back side of the metal plate, a first resist mask having openings that are to be used for forming a second plating layer serving as external connecting portions; a step of forming, in the openings of the first resist mask on the front side of the metal plate, the first plating layer serving as the internal connecting portions, as well as forming, in the openings of the first resist mask on the back side of the metal plate, the second plating layer serving as the external connecting portions; a step of removing the first resist masks from both of the front side and the back side of the metal plate; a step of forming, on the front side of the metal plate, a second resist mask that covers the first plating layer but has openings for leaving the remaining portions of the front side uncovered, as well as forming, on the back side of the metal plate, a second resist mask that covers the entirety of the back side; a step of performing half-etching down to a predetermined depth from the front side of the metal plate upon use of the second resist masks on both of the front side and the back side as etching masks, to form a first concavity; a step of forming fixing resin in the first concavity, to thereby complete a first resin member; and a step of forming, on a front-side surface of the first resin member, a second resin member having openings that leave the faces serving as the internal connecting portions uncovered.

Therefore, according to some embodiments of the present invention, there can be attained a lead frame for QFN-package manufacturing that provides easy control of molten solder and thus can prevent a short circuit with adjacent terminals caused by solder bleeding, in assembly of a semiconductor device conducted by forming solder on terminals of a substrate, mounting a semiconductor element and interconnecting the semiconductor element and the terminals of the substrate via the solder melted by reflow.

Hereinafter, embodiments of the present invention will be described in reference to the drawings.

First Embodiment

Figure 1B:
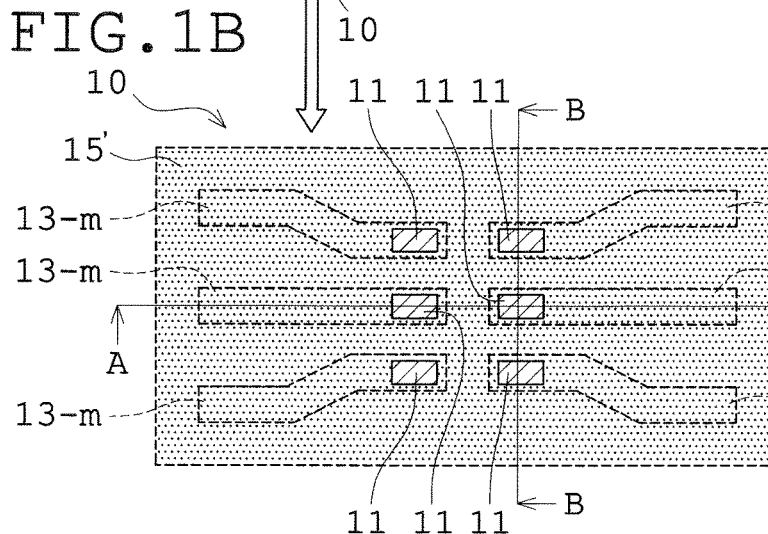
Figure 1D:
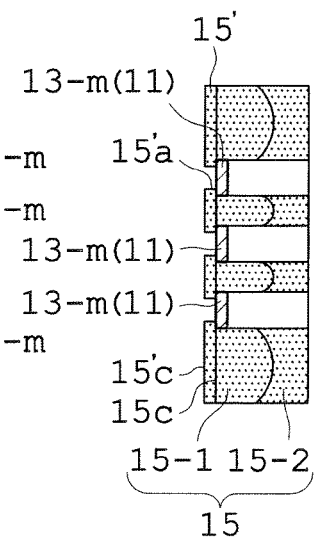
Figure 1C:
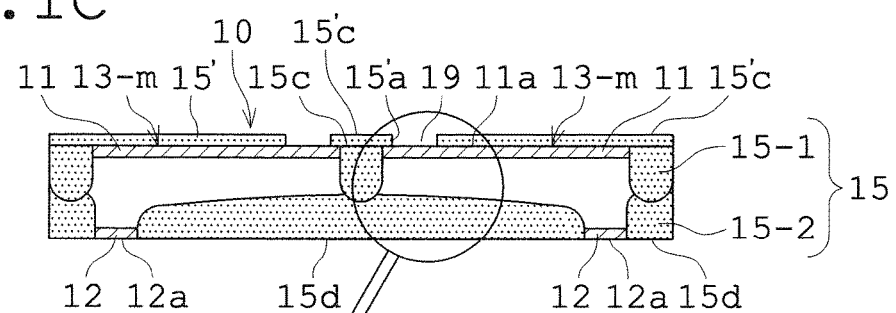
Figure 1E:
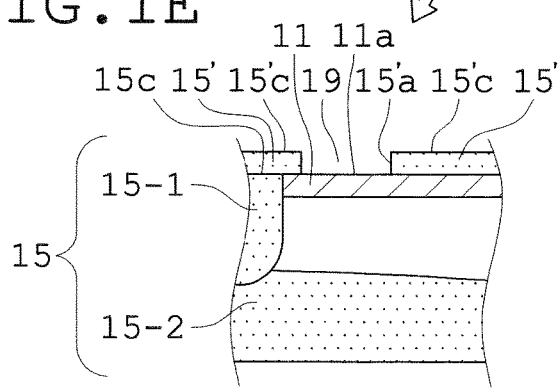

FIGS. 1A-1E show a configuration of a lead frame according to a first embodiment of the present invention, where FIG. 1A is a plan view of a multi-row lead frame, FIG. 1B is a plan view from a front side of an individual lead frame arranged in the multi-row lead frame of FIG. 1A, FIG. 1C is a cross-sectional view taken along A-A in FIG. 1B, FIG. 1D is a cross-sectional view taken along B-B in FIG. 1B, and FIG. 1E is an enlarged partial view of FIG. 1C. FIGS. 2A-2H are explanatory diagrams that show a manufacturing procedure of the multi-row lead frame of the first embodiment. FIG. 3 is a cross-sectional view that shows the state where a semiconductor element is mounted upon use of the multi-row lead frame of the first embodiment manufactured through the manufacturing procedure shown in FIGS. 2A-2H.

The multi-row lead frame of the first embodiment is composed of a collective of lead frames 10 arrayed in a matrix as shown in FIG. 1A.

As shown in FIG. 1B, each lead frame 10 is configured to provide a plurality of leads 13-$m$ (where m is each natural number from 1 to X, and X is a predetermined natural number equal to or larger than 2), a first resin member 15, and a second resin member 15'.

As shown in FIG. 1C, the individual leads 13-$m$ are provided with a first plating layer 11 that is to serve as internal connecting portions and a second plating layer 12 that is to serve as external connecting portions.

Also, each of the leads 13-$m$ is formed to have a predetermined shape with its face on the front side (the upper-surface side of the lead frame 10 shown in FIG. 1C) being larger than its face on the back side (the lower-surface side of the lead frame 10 shown in FIG. 1C).

The first plating layer 11 includes a metal plating layer and a noble metal plating layer formed in this order on the front-side faces of the leads 13-$m$.

The second plating layer 12 includes a metal plating layer and a noble metal plating layer formed in this order on the back-side faces of the leads 13-$m$.

The first resin member 15 is configured of fixing resin 15-1 and reinforcing resin 15-2 integrally joined together, leaves, in a front-side surface 15$c$ thereof, the faces that are to serve as internal connecting portions of the individual leads 13-$m$ uncovered, leaves, in a back-side surface 15$d$ thereof, the faces that are to serve as external connecting portions of the individual leads 13-$m$ uncovered, and fixes adjacent leads to one another.

The fixing resin 15-1 and the reinforcing resin 15-2 are made of a molding resin or a potting resin.

The second resin member 15' is made of a permanent resist, a molding resin, a polyimide tape or a potting resin, is formed on the front-side surface 15$c$ of the first resin member 15, and has openings 15' a that leave front-side faces 11$a$ of the first plating layer 11 that are to serve as internal connecting portions uncovered.

Each of the openings 15' a is formed to have such a size as to leave a part of each front-side face 11$a$, which is to serve as an internal connecting portion, of the first plating layer 11 uncovered. It is noted that each of the openings 15'$a$ may have such a size as to leave the entirety of each front-side face 11$a$, which is to serve as an internal connecting portion, of the first plating layer 11 uncovered.

As shown in FIG. 1C and FIG. 1E, in the multi-row lead frame of this embodiment, a front-side surface 15'$c$ of the second resin member 15' is formed to be at a level higher by 0.05 mm to 0.1 mm than each front-side face 11$a$, which is to serve as an internal connecting portion, of the first plating layer 11, so that the side face of each opening 15' a of the second resin member 15' on the front side and the front-side face 11$a$ of the first plating layer 11 form a concavity 19.

A back-side surface 15$d$ of the first resin member 15 is formed to be substantially at a same level as back-side faces 12$a$, which are to serve as external terminal portions, of the second plating layer 12.

The multi-row lead frame of the first embodiment thus configured can be manufactured, for example as follows. Description of pre-treatment and post-treatment including chemical cleaning, aqueous washing and the like carried out in each step of the manufacturing is omitted for convenience's sake.

First, a copper material with a thickness of 0.1 mm to 0.25 mm is prepared as the metal plate 1.

Then, dry film resists for making the first resist masks are made to laminate both surfaces of the metal plate 1 as a substrate. Here, regarding the dry film resists to be made to laminate the both surfaces of the metal plate 1 respectively, those having a thickness greater than a predetermined value are used so that a first resist mask 30 on the front side (the upper-surface side of the metal plate 1 shown in FIG. 2A) to be formed in a later step is thicker than the thickness of the first plating layer 11 and so that a first resist mask 30 on the back side (the lower-surface side of the metal plate 1 shown in FIG. 2A) to be formed in a later step is thicker than the thickness of the second plating layer 12.

Then, the front-side dry film resist is exposed and developed upon use of a glass mask that carries a pattern (here, referred to as a pattern A) at a predetermined position for masking only the sites corresponding to the first plating layer 11 that is to serve as internal connection portions while leaving the remaining sites unmasked, and the back-side dry film resist is exposed and developed upon use of a glass mask that carries a pattern (here, referred to as a pattern B) at a predetermined position for masking only the sites corresponding to the second plating layer 12 that is to serve as external connecting portions while leaving the remaining sites unmasked. Thereby, a first resist mask 30 having pattern-A openings is formed on the front-side surface, and a first resist mask 30 having pattern-B openings is formed on the back-side surface.

The exposure and development is carried out by a conventional known method. For example, a dry film resist as covered with a glass mask is irradiated with ultraviolet rays, for lowering its solubility in a developer at sites irradiated with the ultraviolet rays passing through the glass mask and then removing the rest of the dry film resist other than these sites, to thereby form a resist mask. Here, while a negative dry film resist is used as the resist, a negative liquid resist may be used for formation of a resist mask. Further, a dry film resist or liquid resist of positive type may be used, for increasing its solubility in a developer at sites irradiated with the ultraviolet rays passing through a glass mask and then removing these sites, to thereby form a resist mask.

Figure 2A:
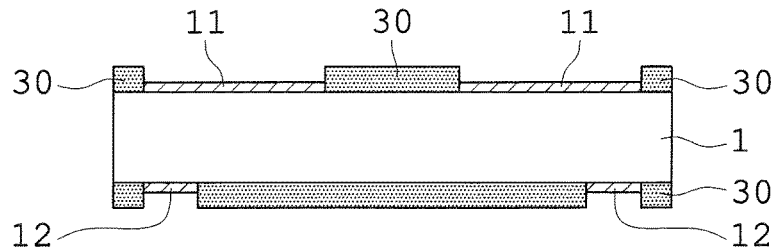
FIGS. 2A-2H are explanatory diagrams that show a manufacturing procedure of the multi-row lead frame of the first embodiment.
Figure 3:
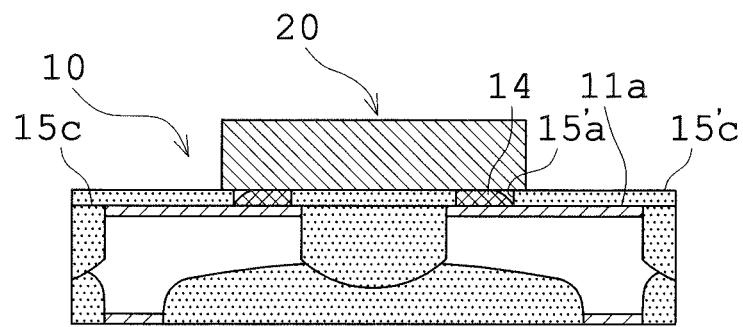
FIG. 3 is a cross-sectional view that shows the state where a semiconductor element is mounted upon use of the multi-row lead frame of the first embodiment manufactured through the manufacturing procedure shown in FIGS. 2A-2H.

Then, the first plating layer 11 is formed on the sites of the metal plate 1 free from covering by the first resist mask 30 having the pattern-A openings, as well as the second plating layer 12 is formed on the sites of the metal plate 1 free from covering by the first resist mask 30 having the pattern-B openings (See FIG. 2A).

Regarding the first plating layer 11, a metal plating layer and a noble metal plating layer are formed in this order. For example, Ni plating, Pd plating and then Au plating are sequentially applied so that a Ni plating layer, a Pd plating layer and an Au plating layer are formed to have predetermined thicknesses, respectively, and so that the faces of the uppermost plating layer (Au plating layer) are at a level lower than the surface of the first resist mask having the pattern-A openings. It may be configured so that, without providing a Ni plating layer, Pd plating and Au plating are sequentially applied to form a Pd plating layer and an Au plating layer having predetermined thicknesses, respectively. A metal to form a plating layer that is to serve as joining faces of external terminals in the second plating layer is appropriately selectable among those solder-bondable with external materials, such as Ni, Pd, Au and Sn.

Figure 2B:
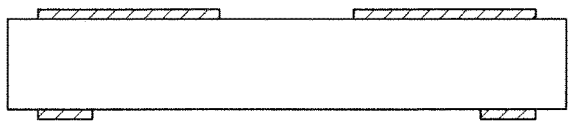

Then, the first resist masks 30 formed on the both surfaces of the metal plate 1 are removed (See FIG. 2B).

Again, dry film resists are made to laminate the both surfaces of the metal plate 1.

Then, the front-side dry film resist is exposed and developed upon use of a glass mask that carries a pattern (here, referred to as a pattern C) for masking only sites that are substantially the same in shape and size as or slightly larger than the faces of the first plating layer while leaving the remaining sites unmasked, to thereby form a second resist mask 31 having pattern-C openings, whereas the back-side dry film resist is exposed and developed, to thereby forma second resist mask 31 that covers the entire surface.

Figure 2C:
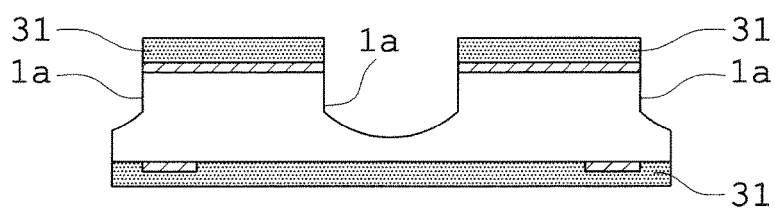

Then, half-etching is performed down to a predetermined depth from the front side of the copper material forming the metal plate 1 upon use of the second resist masks 31 as etching masks, to thereby form a first concavity 1a (See FIG. 2C).

Figure 2D:
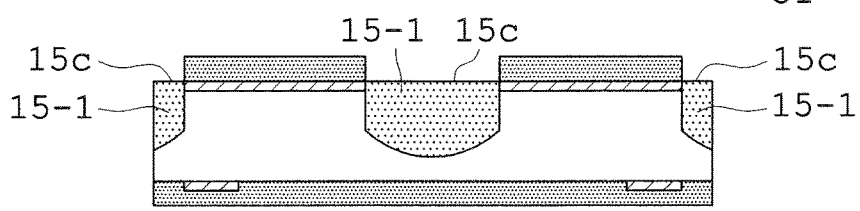

Then, the fixing resin 15-1 is formed in the first concavity 1a (See FIG. 2D). In the case where the fixing resin 15-1 is formed of a molding resin, the molding resin is molded by use of a die and then is dried.

In the case where the fixing rein 15-1 is formed of a potting resin, the potting resin is applied into the first concavity 1a and then is dried.

Figure 2E:
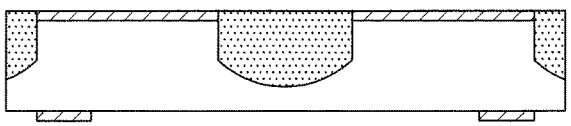

Then, the second resist masks 31 formed on the both surfaces of the metal plate 1 are removed (See FIG. 2E).

Figure 2F:
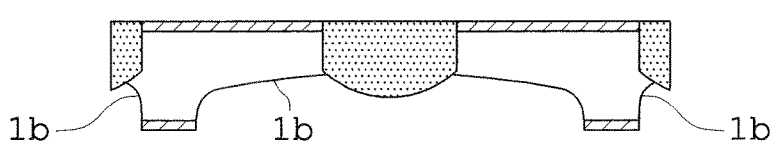

Then, etching is performed from the side of the metal plate 1 where the second plating layer 12 is formed (i.e. the back side) for unearthing the fixing resin 15-1 upon use of the second plating layer 12 as an etching mask, to thereby form a second concavity 1b with a bottom surface thereof being made of the fixing resin 15-1 (See FIG. 2F).

Figure 2G:
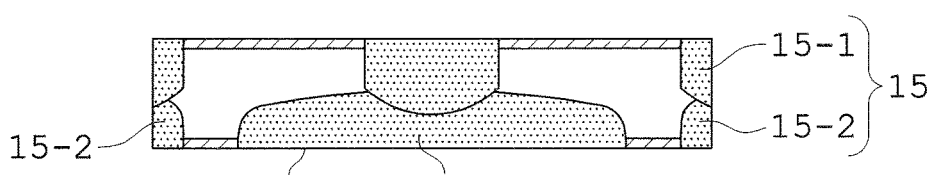

Then, reinforcing resin 15-2 is formed in the second concavity 1b to be integrally connected with the fixing resin 15-1, to thereby complete a first resin member 15 (See FIG. 2G).

In the case where the reinforcing resin 15-2 is formed of a molding resin, the molding resin is molded by use of a die and then is dried.

In the case where the reinforcing rein 15-2 is formed of a potting resin, the potting resin is applied into the second concavity 1b and then is dried.

Figure 2H:
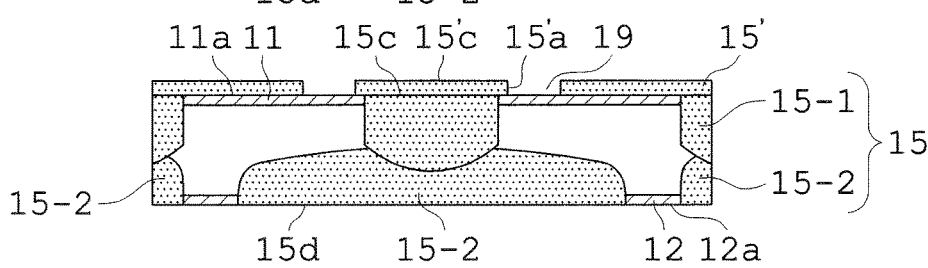

Then, on a front-side surface 15c of the first resin member 15, formed is a second resin member 15' having openings 15'a that leave a part of each of the faces 11a serving as the internal connecting portions uncovered (See FIG. 2H).

In the case where the second resin member 15' is formed of a permanent resist, the front side of the metal plate 1 is laminated with a permanent resist having a thickness about 0.05 mm to 0.1 mm and then is exposed and developed upon use of a glass mask that carries a pattern (here, referred to as a pattern D) for masking or leaving unmasked only the sites corresponding to the openings 15'a while leaving unmasked or masking the remaining sites.

In the case where the second resin member 15' is formed of a molding resin, the molding resin is molded by use of a die and then is dried.

In the case where the second resin member 15' is formed of a polyimide tape, a polyimide tape with a thickness about 0.05 mm to 0.1 mm that has already been punched at sites corresponding to the openings 15'a is prepared, and then is stuck on the front side of the metal plate 1. Alternatively, a non-punched polyimide tape is stuck on the front side of the metal plate 1 and then is punched by irradiation of the sites corresponding to the openings 15' with laser.

Thereby, the multi-row lead frame of this embodiment is completed.

In an individual lead frame 10 as completed, a part of each of the front-side faces 11a of the first plating layer 11, which is to serve as an internal connecting portion, is left uncovered at each of the openings 15'a of the second resin member 15', and each of the back-side faces 12a of the second plating layer 12, which is to serve as an external connecting portion, is left uncovered in the back-side surface 15d of the first resin member 15. The front-side surface 15'c of the second resin member 15' is formed to be at a level higher than the front-side faces 11a of the first plating layer, which are to serve as internal connecting portions. The back-side surface 15d of the first resin member 15 is formed to be substantially at a same level as the back-side faces 12a of the second plating layer 12, which are to serve as external connecting portions.

Manufacturing a semiconductor device using the lead frame of the first embodiment manufactured in this manner is performed in the following manner. FIG. 3 is a cross-sectional view that shows the state where a semiconductor element is mounted upon use of the multi-row lead frame of the first embodiment manufactured through the manufacturing procedure shown in FIGS. 2A-2H.

With connecting solder 14 being sandwiched between uncovered portions of the faces 11a of the first plating layer 11, which are to serve as internal connecting portions of the lead frame 10 shown in FIG. 2H, and electrodes of a semiconductor element 20, the semiconductor element 20 is mounted on the lead frame, and then heat is applied to melt the connecting solder 14, to thereby establish flip-chip connection between the first plating layer 11, which is to serve as internal connecting portions, and the electrodes of the semiconductor element 20 (See FIG. 3).

Each of the front-side faces 11a of the first plating layer 11, which constitutes the bottom surface of each of the concavities 19, is a surface to be connected with connecting solder 14 in flip-chip mounting of a semiconductor element via the connecting solder 14. According to the multi-row lead frame of this embodiment, since the configuration is made so that the front-side surface 15'c of the second resin member 15' is formed at a level higher than the front-side faces 11a of the first plating layer 11, which are to serve as internal connecting portions, each of the front-side faces 11a of the first plating layer 11, as the bottom surface of each of the concavities 19, is surrounded by the side face of each of the openings 15'a of the second resin member 15', which constitutes the side face of the concavity 19. Therefore, when the connecting solder 14 gets melted, the molten solder 14 is prevented from flowing in the horizontal direction by the side face of the concavity 19. Also, the capacity of the concavity 19 prevents overflow of the molten solder out of the concavity 19.

Therefore, according to the first embodiment, since control of molten solder 14 comes to be easier, it is possible to prevent solder bleeding and to prevent short circuit of the wiring caused by contact of bleeding solder with adjacent terminals.

According to the lead frame of the first embodiment, since each lead 13-m is formed into a predetermined shape with its front-side face being larger than its back-side face, the lead 13-m substantially has a L-shape or T-shape as viewed from the lateral side, and thus adhesion to the first resin member 15 is improved, to prevent the lead 13-m from corning off the first resin member 15.

Therefore, according to the lead frame of the first embodiment, in assembly of a semiconductor device conducted by forming solder on terminals of a substrate, mounting a semiconductor element and interconnecting the semiconductor element and the terminals of the substrate via the solder melted by reflow, molten solder comes to be easily controllable and thus a short circuit with adjacent terminals caused by solder bleeding can be prevented.

Example

Hereafter, an explanation will be made, as an example, of a multi-row lead frame that was fabricated based on the first embodiment of the present invention and the manufacturing method therefor.

Description of pre-treatment and post-treatment including chemical cleaning, aqueous washing and the like carried out in each step of the manufacturing is omitted for convenience's sake.

First, a copper material with the thickness of 0.2 mm, which is commonly used as a lead frame material, was prepared as the metal plate 1.

Then, dry film resists with the thickness of 25 μm were made to laminate both surfaces of the copper material, respectively, the front-side dry film resist was exposed upon use of a glass mask that carried a pattern A for forming, at a predetermined position, the first plating layer 11 serving as internal connecting portions, the back-side dry film resist was exposed upon use of a glass mask that carried a pattern B for forming, at a predetermined position, the second plating layer 12 serving as external terminals, and development was performed. Thereby, a first resist mask 30 that had pattern-A openings, in which the first plating layer is to be formed, was formed on the front side, and a first resist mask 30 that had pattern-B openings, in which the second plating layer is to be formed, was formed on the back side.

Then, on the front side, after a common re-treatment for plating, the copper material, at sites free from covering by the first resist mask 30 having the pattern-A openings, was plated with a Ni plating layer of 4 μm or more, a Pb plating layer of 0.01 μm or more, and an Au plating layer of 0.003 μm or more in this order, to thereby form the first plating layer 11. Whereas, on the back side, after a common re-treatment for plating, the copper material, at sites free from covering by the first resist mask 30 having the pattern-B openings, was plated with a Ni plating layer of 4 μm or more, a Pb plating layer of 0.01 μm or more, and an Au plating layer of 0.003 μm or more, and in this order, to thereby form the second plating layer 12. (See FIG. 2A).

Then, the first resist masks 30 were peeled off the both surfaces (See FIG. 2B), which were again laminated with dry film resists, respectively.

Then, the front-side dry film resist was exposed and developed upon use of a glass mask that carried a pattern C for masking only sites that were substantially the same in shape and size as or slightly larger than faces of the previously-formed first plating layer 11 while leaving the remaining sites unmasked, to thereby form a second resist mask 31 having pattern-C openings, whereas a second resist mask 31 covering the entire surface was formed on the back side.

Then, half-etching was performed down to a predetermined depth from the front side of the copper material forming the metal plate 1 upon use of the second resist masks 31 as etching masks, to thereby form a first concavity 1a (See FIG. 2C).

Then, a molding resin was molded with a die in the first concavity 1a and then was dried, to thereby form the fixing resin 15-1 (See FIG. 2D).

Then, the second resist masks 31 formed on the both surfaces of the metal plate 1 were removed (See FIG. 2E).

Then, etching was performed from the back side of the copper material forming the metal plate 1 for unearthing the fixing resin 15-1 upon use of the second plating layer 12 as an etching mask, to thereby form a second concavity 1b with a bottom surface thereof being made of the fixing resin 15-1 (See FIG. 2F).

Then, a molding resin was molded with a die in the second concavity 1b and then was dried, to form the reinforcing resin 15-2 integrally connected with the fixing resin 15-1. In this way, the first resin member 15 was completed (See FIG. 2G).

Then, the front side of the metal plate 1 was laminated with a permanent resist having the thickness of 0.05 mm and then was exposed and developed upon use of a glass mask that carried a pattern D for masking only the sites corresponding to the openings 15'a while leaving the remaining sites unmasked, so that, on the front-side surface 15c of the first resin member 15, there was formed the second resin member 15' with openings 15'a for leaving a part of each of the faces 11a serving as the internal connecting portions uncovered. In this way, the multi-row lead frame shown in FIG. 2H was obtained.

In the individual lead frame 10 as completed, a part of each of the front-side faces 11a of the first plating layer 11, as an internal connecting portion, was left uncovered at each of the openings 15' a of the second resin member 15', and each of the back-side faces 12a of the second plating layer 12, as an external connecting portion, was left uncovered in the back-side surface 15d of the first resin member 15. The front-side surface 15'c of the second resin member 15' was formed to be at a level higher than the front-side faces 11a of the first plating layer 11, as internal connecting portions. The back-side surface 15d of the first resin member 15 was formed to be substantially at a same level as the back-side faces 12a of the second plating layer 12, as external connecting portions.

When a semiconductor element got connected by flip-chip connection by use of this semiconductor substrate, the first plating layer 11 serving as internal connecting portions and electrodes of the semiconductor element 20 were interconnected via the solder 14 as shown in FIG. 3. In that situation, the molten solder 14 was prevented from flowing in the horizontal direction by the side faces of the concavities 19. Also, the capacity of the concavities 19 prevented overflow of the molten solder.

While one embodiment and its corresponding example as reduced into realization of the multi-row lead frame of the present invention have been described above, the multi-row lead frame of the present invention is not limited to the configurations of the above embodiment and example.

For example, while in the multi-row lead frame of the first embodiment, Ni, Pd, and Au are used for the first plating layer and Ni, Pd, and Au are used for the second plating layer, a combination of plating layers used for forming the first plating layer and the the second plating layer is not limited to this. For example, the Au layer in the first plating layer may be replaced by an Ag layer. Also, plating the metal plate with Ni as the bottom layer of the second plating layer is preferable but not indispensable. Table 1 below shows several examples of such a modification in combination of the first plating layer and the second plating layer. Table 1 is to be read so that plating with each metal is applied in order from the top of the column in each modified example.

TABLE 1

Combination of plating Constituting Lead Frame

| | Modified Example | | | | | | | | |
|---|---|---|---|---|---|---|---|---|---|
| | 1 | 2 | 3 | 4 | 5 | 6 | 7 | 8 | 9 |
| 1st plating layer | Ni Au | Ni Ag | Ni Pd Au | Ni Au | Ni Ag | Ni Pd Au | Ni Pd Ag | Ni Pd | Ni Pd |
| 2nd plating layer | Au | Au | Au | Pd Au | Pd Au | Pd Au | Au | Au | Pd Au |

Figure 4A:
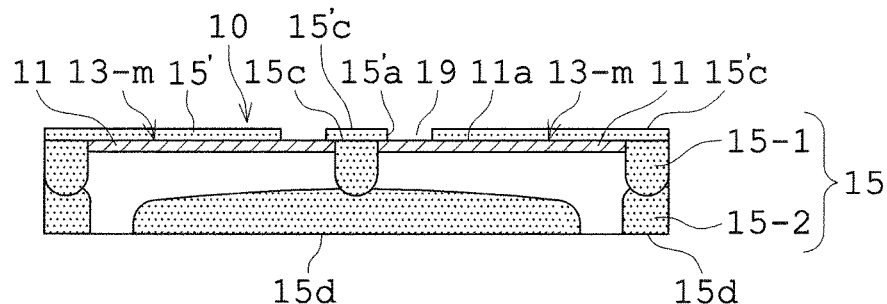
FIGS. 4A-4E are cross-sectional views that respectively show various modified examples of the multi-row lead frame of the first embodiment.

Also, for example, while in the multi-row lead frame according to the first embodiment and its corresponding example, both of the face to serve as an internal connecting portion and the face to serve as an external connecting portion of each of the leads 13-m are provided with plating layers (the first plating layer 11 and the second plating layer 12), the configuration may be made so that a plating layer is formed on either one of the face to serve as an internal connecting portion and the face to serve as an external connecting portion, as shown in FIG. 4A (in the example of FIG. 4A, the face to serve as an internal connecting portion is plated).

Figure 4B:
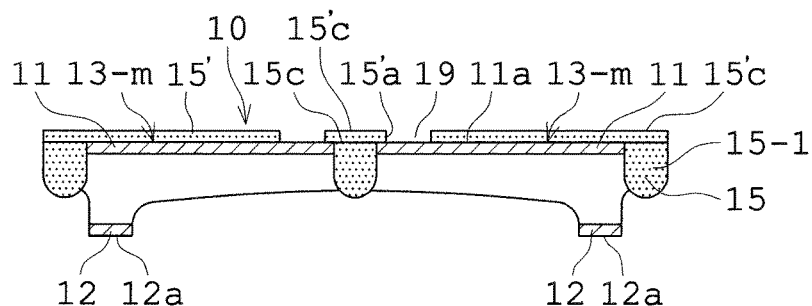

Also, for example, while in the multi-row lead frame according to the first embodiment and its corresponding example, the first resin member 15 is formed of the fixing resin 15-1 and the reinforcing resin 15-2 integrally joined together, the first resin member 15 may be formed of the fixing resin 15-1 alone, as shown in FIG. 4B.

The example of the multi-row lead frame shown in FIG. 4B can be fabricated, in the manufacturing procedure of the multi-row lead frame shown in FIGS. 2A-2H, by forming the second resin member 15' after formation of the second concavity 1b shown in FIG. 2F as leaving out the step of forming the reinforcing resin 15-2 in the second concavity 1b (See FIG. 2G).

Figure 4C:
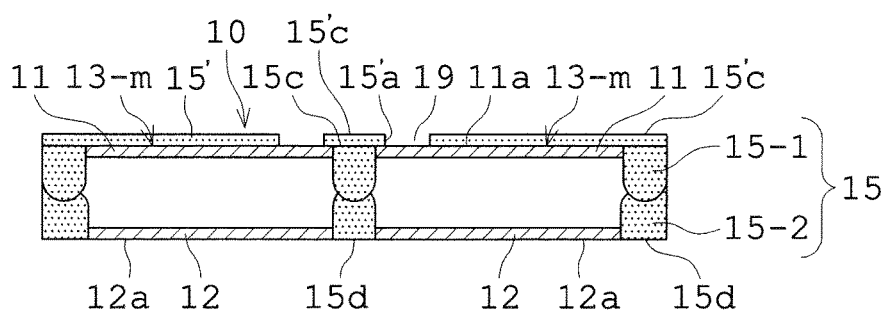

Also, for example, while in the multi-row lead frame according to the first embodiment and its corresponding example, each of the leads 13-m is formed to have a predetermined shape with its face on the front side (the upper-surface side of the lead frame 10 shown in FIG. 1C) being larger than its face on the back side (the lower-surface side of the lead frame 10 shown in FIG. 1C), each of the leads 13-m may be formed to have a predetermined shape with both of the faces thereof having substantially the same size, as shown in FIG. 4C.

Figure 4D:
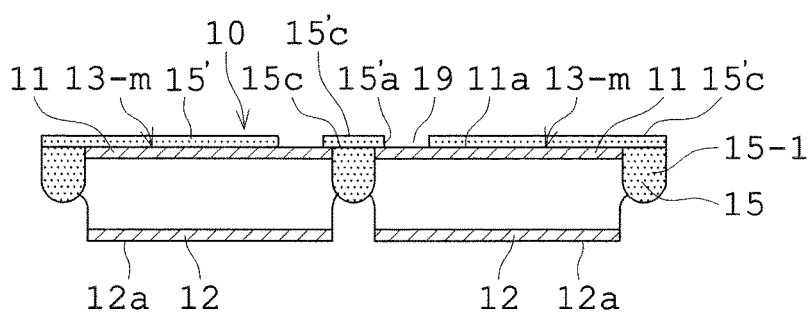

Also, for example, the configuration may be made so that each of the leads 13-m is formed to have a predetermined shape with both of the faces thereof having substantially the same size as well as the first resin member 15 is formed of the fixing resin 15-1 alone, as shown in FIG. 4D.

Figure 4E:
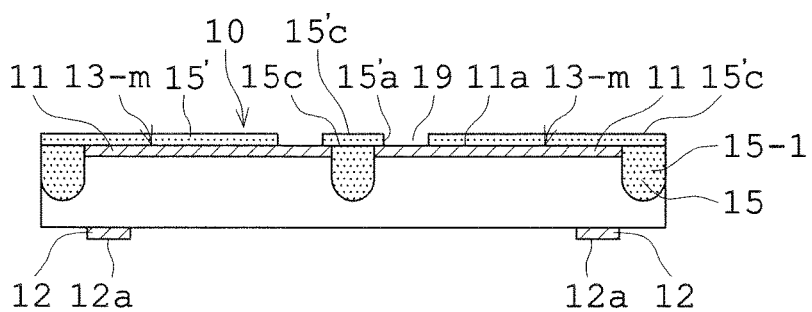

Also, for example, while in the multi-row lead frame according to the first embodiment and its corresponding example, the configuration is made so that faces that are to serve as internal connecting portions of the plurality of leads 13-m are left uncovered on the side of the front-side surface of the first resin member 15 and faces that are to serve as external connecting portions of the plurality of leads 13-m are left uncovered on the side of the back-side surface of the first resin member 15 by forming the first concavity 1a from the front side of the metal plate 1, forming the fixing resin 15-1 in the first concavity 1a, forming the second concavity 1b from the back side of the metal plate 1 with the bottom surface thereof being made of the fixing resin 15-1, and forming the reinforcing resin 15-2 in the second concavity 1b to be integrally connected with the fixing resin 15-1, the configuration may be made so that the metal plate 1 is partitioned by the first concavity 1a on the front side into a plurality of lead portions 13-m, which have side faces thereof fixed with the first resin member 15 composed of the fixing resin 15-1 alone, by forming only the first concavity 1a and the fixing resin 15-1 without forming the second concavity 1b or the reinforcing resin 15-2, as shown in FIG. 4E.

The example of the lead frame shown in FIG. 4E can be fabricated, in the manufacturing procedure of the multi-row lead frame shown in FIGS. 2A-2H, by forming the second resin member 15' after formation of the fixing resin 15-1 shown in FIG. 2D and removal of the second resist masks 31 shown in FIG. 2E as leaving out the step of forming the second concavity 2b (See FIG. 2F) and the step of forming the reinforcing resin 15-2 (See FIG. 2G).

In manufacturing a semiconductor device using the multi-row lead frame of the example shown in FIG. 4E, after flip-chip connection is established between the first plating layer 11 serving as internal connecting portions and electrodes of a semiconductor element 20 as shown in FIG. 3, the semiconductor-element mounting side (front side) is sealed with a sealing resin, and then a second concavity 1b with a bottom surface thereof being made of the fixing resin 15-1 is formed by use of the second plating layer 12 as an etching mask. Thereby, the leads 13-m are completed. In addition, reinforcing resin 15-2 may be formed in the second concavity 1b thus formed to be integrally connected with the fixing resin 15-1.

What is claimed is:
1. A lead frame comprising:
a plurality of leads formed from a metal plate having a front side and a back side;
a first resin member formed to fill spaces between the plurality of leads; and
a second resin member,
wherein the plurality of leads are provided with a plating layer formed on a front-side surface of the metal plate at top portions of the plurality of leads, a front-side surface of the plating layer forming faces that are to serve as internal connecting portions of the plurality of leads,
wherein the first resin member is formed of a fixing resin and a reinforcing resin integrally joined together, with a front-side surface of the fixing resin being coplanar with the front-side surface of the plating layer so that the plurality of leads have side faces thereof from the front side to the back side fully fixed with the first resin member,
wherein the second resin member is formed of a permanent resist or a polyimide tape, applied to a planar surface formed of the front-side surface of the fixing resin of the first resin member and the front-side surface of the plating layer, so as to be at a level higher than the faces that are to serve as the internal connecting portions of the plurality of leads, and the second resin member has openings for leaving the faces that are to serve as the internal connecting portions of the plurality of leads uncovered,
wherein the openings in the second resin member are arranged at positions over which a semiconductor element is to be mounted, so as to allow flip chip connection of the semiconductor element with the internal connecting portions of the plurality of leads via connecting solder filled in recesses formed by the internal connecting portions of the plurality of leads and inner circumferential faces of the openings in the second resin member, and wherein each of the recesses formed by the internal connecting portions of the plurality of leads and the inner circumferential faces of the openings in the second resin member has a capacity sufficient to prevent the connecting solder as melted from overflowing, so that the semiconductor element and the internal connecting portions of the plurality of leads are to be connected to each other via the connecting solder while a back surface of the semiconductor element is fitted to the second resin layer.

2. The lead frame according to claim 1,
wherein each of the openings in the second resin member is formed to have a size so as to leave an entirety or a part of each of the faces that are to serve as internal connecting portions of the plurality of leads uncovered.

3. The lead frame according to claim 1,
wherein each of the plurality of leads is formed to have a front-side face which is larger than a back-side face.

4. The lead frame according to claim 1,
wherein the plating layer is a first plating layer and the plurality of leads are provided with a second plating layer formed on a back-side surface of the metal plate at bottom portions of the plurality of leads, a back-side surface of the second plating layer forming faces that are to serve as external connecting portions of the plurality of leads.

5. The lead frame according to claim 1,
wherein the plurality of leads are to be connected to each other via the connecting solder while an entirety of the back surface of the semiconductor element is fitted to the second resin layer.

6. A lead frame comprising:
a metal plate partitioned into a plurality of lead portions by a concavity formed on a front-side surface thereof;
a plating layer formed on the front-side surface of the metal plate at top portions of the plurality of lead portions;
a first resin member formed to fill the concavity between the plurality of lead portions; and
a second resin member,
wherein a front-side surface of the plating layer forms faces that are to serve as internal connecting portions of the plurality of lead portions and is coplanar with a front-side surface of the first resin member so that the plurality of lead portions have side faces thereof fully fixed with the first resin member, wherein the second resin member is formed of a permanent resist or a polyimide tape, applied to a planar surface formed of the front-side surface of the first resin member and the front-side surface of the plating layer, so as to be at a level higher than the faces that are to serve as the internal connecting portions of the plurality of lead portions, and the second resin member has openings for leaving the faces that are to serve as the internal connecting portions of the plurality of lead portions uncovered, wherein the openings in the second resin member are arranged at positions over which a semiconductor element is to be mounted, so as to allow flip chip connection of the semiconductor element with the internal connecting portions of the plurality of lead portions via connecting solder filled in recesses formed by the internal connecting portions of the plurality of lead portions and inner circumferential faces of the openings in the second resin member, and wherein each of the recesses formed by the internal connecting portions of the plurality of lead portions and the inner circumferential faces of the openings in the second resin member has a capacity sufficient to prevent the connecting solder as melted from overflowing, so that the semiconductor element and the internal connecting portions of the plurality of lead portions are to be connected to each other via the connecting solder while a back surface of the semiconductor element is fitted to the second resin layer.

7. The lead frame according to claim 6,
wherein each of the openings in the second resin member is formed to have a size so as to leave an entirety or a part of each of the faces that are to serve as internal connecting portions of the plurality of lead portions uncovered.

8. The lead frame according to claim 6,
wherein the plurality of lead portions are to be connected to each other via the connecting solder while an entirety of the back surface of the semiconductor element is fitted to the second resin layer.

* * * * *